(12) United States Patent
Chia-Yu et al.

(10) Patent No.: US 6,385,049 B1
(45) Date of Patent: May 7, 2002

(54) MULTI-BOARD BGA PACKAGE

(75) Inventors: Hung Chia-Yu; Su Chun-Jen; Lai Chien-Hung, all of Kaohsiung (TW)

(73) Assignee: Walsin Advanced Electronics LTD (TW)

( * ) Notice: Subject to any disclaimer, the term of this patent is extended or adjusted under 35 U.S.C. 154(b) by 0 days.

(21) Appl. No.: 09/897,991

(22) Filed: Jul. 5, 2001

(51) Int. Cl.[7] ................................................ H05K 7/20
(52) U.S. Cl. ...................... 361/721; 174/52.2; 257/738; 257/787; 361/705; 361/784
(58) Field of Search .................. 438/106, 118, 438/125, 126; 29/832, 837, 841; 257/723, 724, 787, 796, 737, 738, 778, 784; 174/16.3, 252, 52.2; 361/704, 705, 707–712, 715–721, 784; 165/80.3, 85

(56) References Cited

U.S. PATENT DOCUMENTS 3,459,998 A  * 8/1969 Focarile
5,359,224 A  * 10/1994 Heinen et al. ............... 257/666
5,717,556 A  * 2/1998 Yanagida .................... 361/803
5,739,585 A  * 4/1998 Akram et al. ............... 257/698
6,031,730 A  * 2/2000 Kroske ........................ 361/784
6,049,129 A    4/2000 Yew et al. ................... 257/737
6,091,140 A  * 7/2000 Toh et al. .................... 257/691
6,177,723 B1 * 1/2001 Eng et al. .................... 257/691

* cited by examiner

Primary Examiner—Gerald Tolin
(74) Attorney, Agent, or Firm—Troxell Law Office PLLC

(57) ABSTRACT

A multi-board BGA package comprises a chip, a plurality of circuit boards, a plurality of metal bonding wires, a plurality of solder balls, and a package body. The circuit boards are formed on a same plane. Between adjacent circuit boards there is a galley for passing through metal bonding wires to connect chip with circuit board and molding package body easily. The plurality of circuit boards together hold the chip so as to reduce thermal stress caused by CTE mismatch.

13 Claims, 5 Drawing Sheets

MULTI-BOARD BGA PACKAGE

FIELD OF THE INVENTION

The present invention is relating to an integrated circuit package, particularly to a BGA package having a plurality of circuit boards.

BACKGROUND OF THE INVENTION

An integrated circuit package with a window BGA packaging type (window Ball Grid Array package) is disclosed in U.S. Pat. No. 6,049,129 "chip size integrated circuit package". FIG. 8 is a cross-sectional view of the integrated circuit package 30 and FIG. 9 is a top view of the integrated circuit package 30. The integrated circuit package 30 comprises a silicon chip 50 having integrated circuit elements. The silicon chip 50 is attached onto a multi-layer printed circuit board 70 by an adhesive layer 60. The multi-layer printed circuit board 70 has a plurality of routing strips 82 and corresponding conductive pads 10, the pad 10 formed on the first surface 92 of printed circuit board 70 is bonded with solder ball 15. An opening 86 is formed at the center area of the printed circuit board 70 for exposing the bonding pads 12 of silicon chip 50 to enable metal bonding wires 80 to pass through and electrically connect bonding pads 12 of chip 50 with routing strips 82 of printed circuit board 70. The potting material 90 can be formed only by potting method because it is divided into two isolated portions around the perimeter of chip 50 and within the opening 86 (blocked by chip 50), however a special mode with multi-injection is required in case of forming the potting material 90 by molding method. Besides, thermal stress of chip 50 and printed circuit board 70 caused by different coefficients of thermal expansion (CTE) results in the deformation of the integrated circuit package 30.

SUMMARY

The main object of the present invention is to provide a multi-board BGA package that has a plurality of circuit boards formed on a same plane to hold at least a chip so as to reduce thermal stress caused by CTE mismatch.

The secondary object of the present invention is to provide a multi-board BGA package that comprises a plurality of circuit boards. A galley formed between adjacent circuit boards for passing through the metal bonding wires to connect chip with circuit boards, and also the package body is easy to be filled during molding process, besides a flexible space is provided for avoiding warping and having better elasticity.

The multi-board BGA package according to the present invention comprises:
- a plurality of circuit boards, each circuit board having a first surface and a second surface, wherein the first surfaces of the plurality of circuit boards are formed on a same plane, and a galley is formed between adjacent circuit boards;
- at least a chip adhered on the second surfaces of circuit boards, the chip having a plurality of bonding pads;
- a plurality of metal bonding wires passing through the foregoing galley and connecting bonding pads of the chip and the circuit boards;
- an encapsulant body formed in the galley and on the second surfaces of circuit boards; and
- a plurality of solder balls bonds on the first surfaces of circuit boards.

DETAILED DESCRIPTION OF THE PRESENT INVENTION

Figure 1:
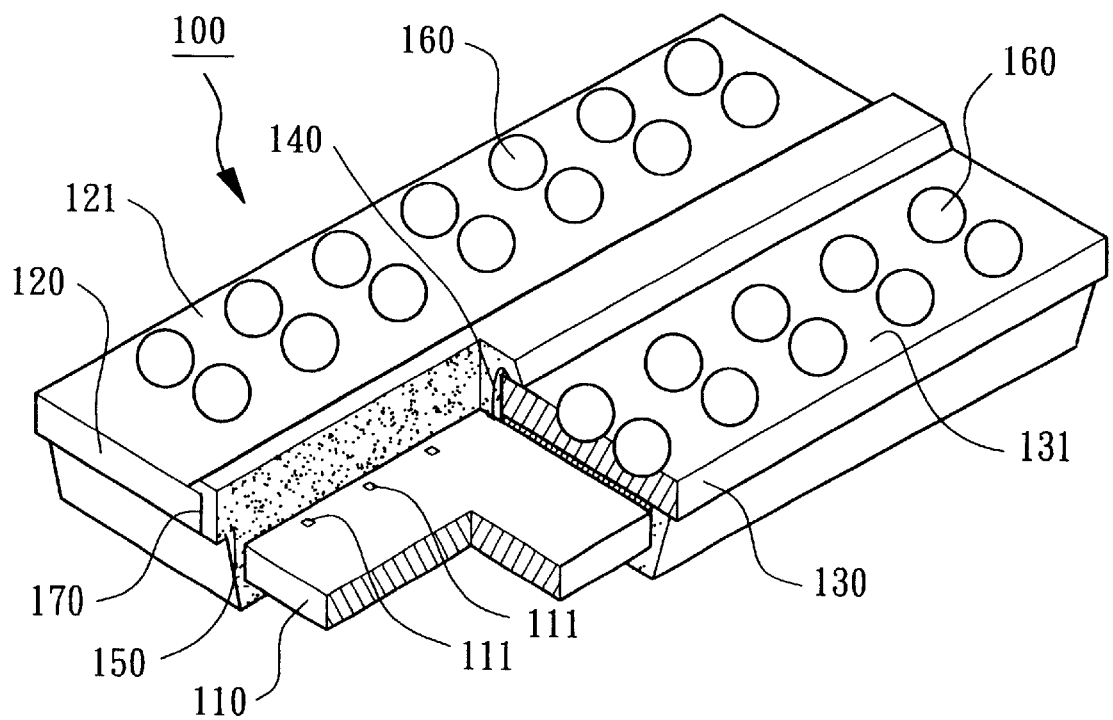
FIG. 1 is a partially sectional perspective view of a multi-board BGA package in accordance with the first embodiment of the present invention.

Referring to the drawings attached, the present invention will be described by means of the embodiments below.

Figure 2:
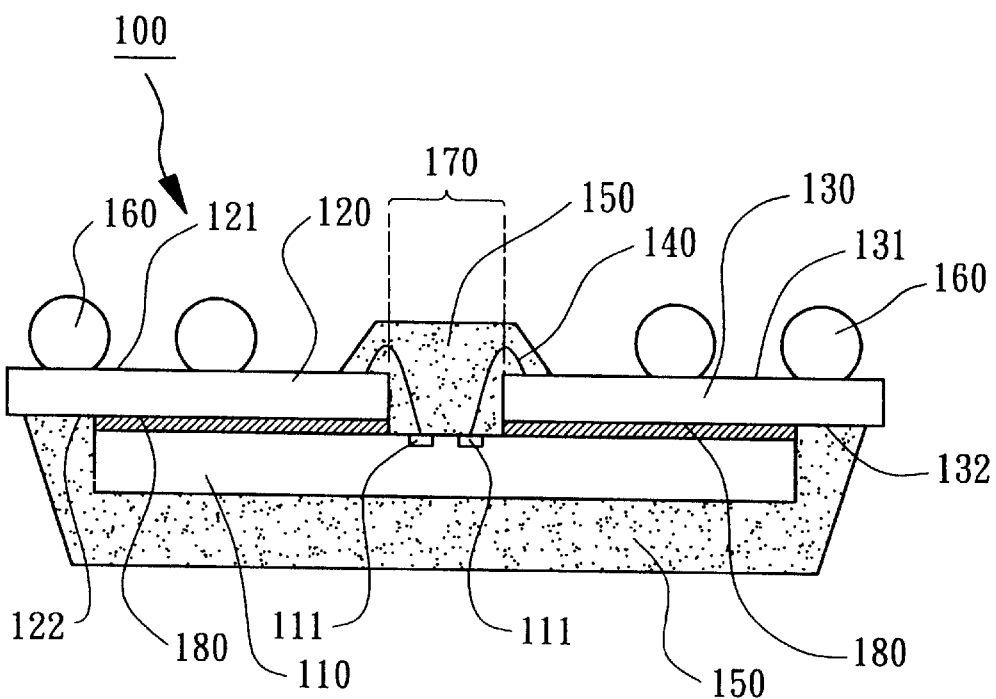
FIG. 2 is a cross-sectional view of a multi-board BGA package in accordance with the first embodiment of the present invention.
Figure 3:
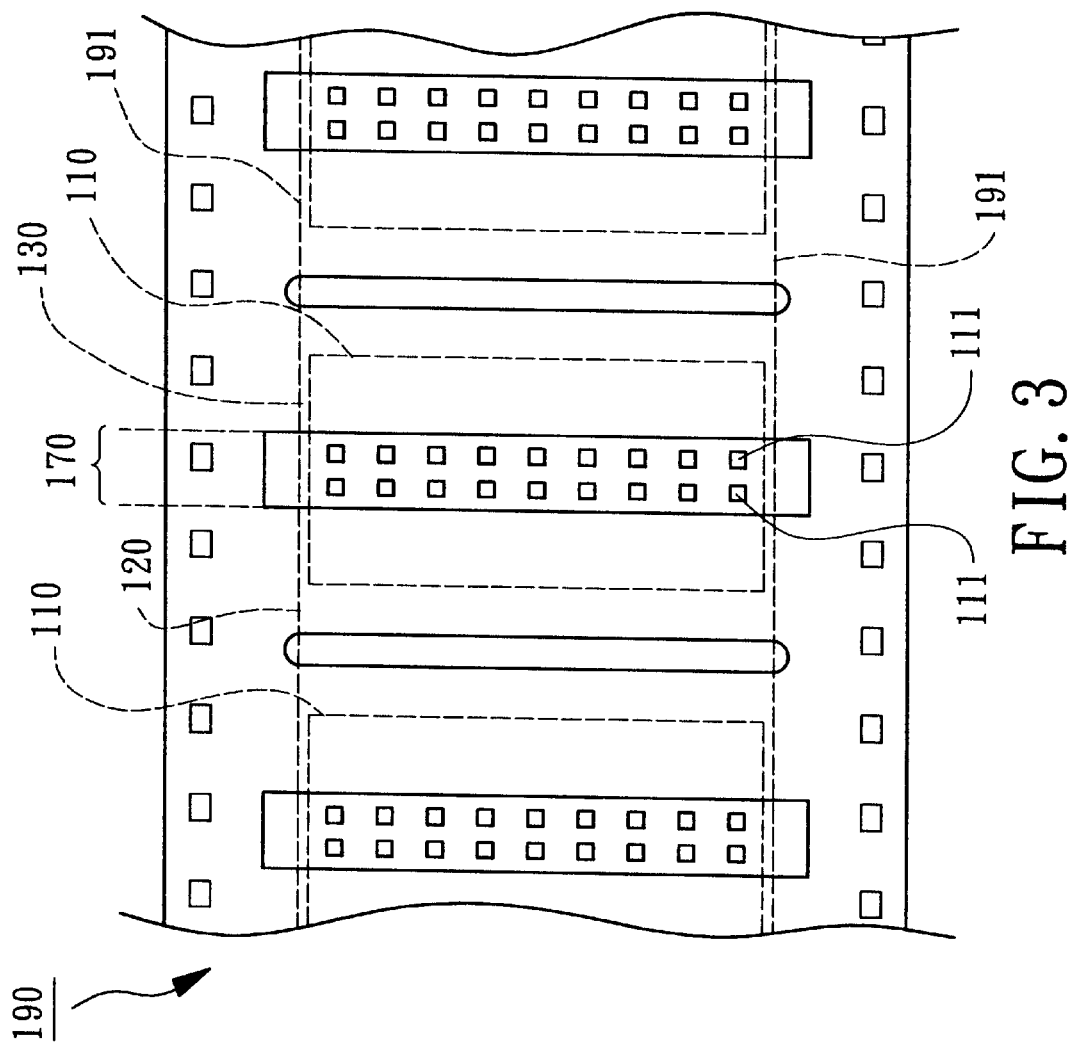
FIG. 3 is a top view of the circuit board for forming the multi-board BGA package in accordance with the first embodiment of the present invention.
Figure 4:
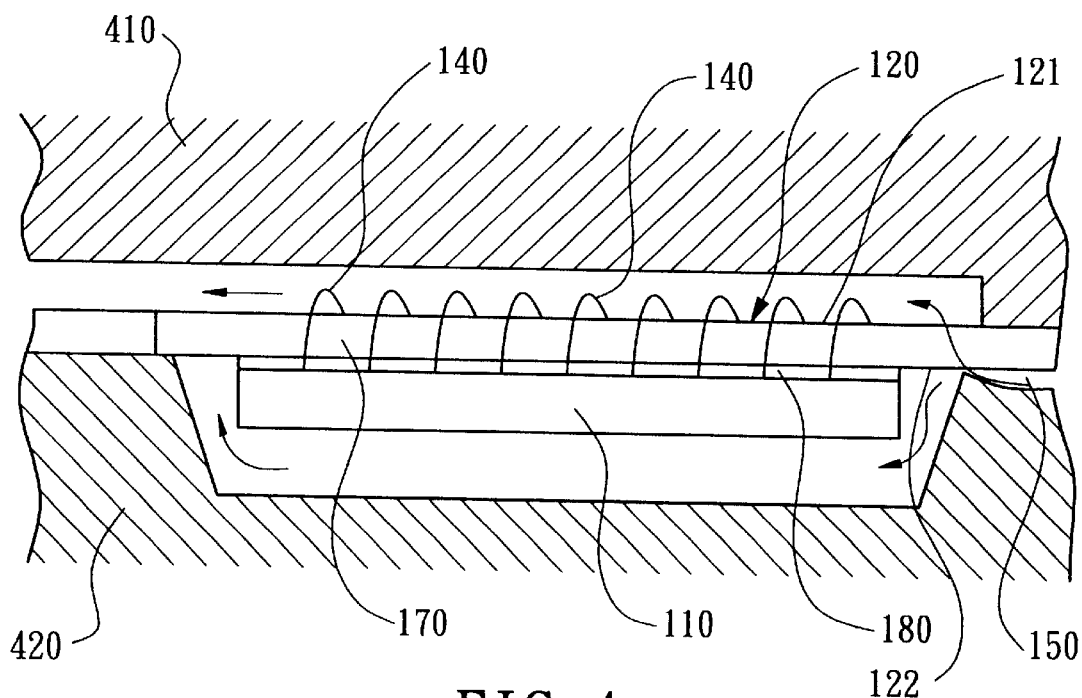
FIG. 4 is a cross-sectional view of the multi-board BGA package during molding process in accordance with the first embodiment of the present invention.

FIG. 1 is a partially sectional perspective view of a multi-board BGA package 100 in accordance with the first embodiment of the present invention. FIG. 2 is a cross-sectional view of the multi-board BGA package 100. FIG. 3 is a top view of the circuit board for forming the multi-board BGA package 100. FIG. 4 is a cross-sectional view of the multi-board BGA package 100 during molding process. However, so called "multi-board BGA package" is an integrated circuit package comprising a plurality of circuit boards formed on a same plane.

As shown in FIG. 1, 2, the multi-board BGA package 100 comprises at least a chip 110, a plurality of circuit boards, a plurality of metal bonding wires 140, a plurality of solder balls 160 and an encapsulant body 150. In this embodiment, there are two circuit boards that are a left circuit board 120 and a right circuit board 130. The plurality of solder balls 160 are formed in a grid array fashion on the surfaces 121, 131 of the left and right circuit board 120, 130. And the left and right circuit board 120, 130 are formed on a same plane, so that it is an integrated circuit package with multi-board BGA (Ball Grid Array) packaging type.

The chip 110 can be a memory chip, microprocessor, logic chip or other chips such as DRAM, SRAM, SDRAM, ROM, EPROM, flash, Rambus or DDR, etc. As shown in FIG. 1, the chip 110 has an integrated circuit forming surface and a plurality of bonding pads 111 formed on the integrated circuit forming surface. The chip 110 is adhered to the first surface 121 of left circuit board 120 and the first surface 131 of right circuit board 130 by the integrated circuit forming surface facing toward the circuit boards 120, 130. For example, the chip 110 is adhered by adhesive compound 180 like double-sided polyimide tape, liquid thermoplastic adhesives or epoxy, etc.

As shown in FIGS. 1, 2, the plurality of circuit boards 120, 130 are micro printed circuit board made from FR-4, FR-5 or BT resin, etc which includes resin material reinforced with glass fiber or co-fired ceramics circuit board. The circuit boards 120, 130 have circuit pattern of single-layer or multi-layer (that is single-layer printed circuit board or multi-layer printed circuit board) or even the polyimide adhesive layer with single-layer circuit pattern. Each circuit board 120, 130 has the first surface 121, 131 and the second surface 122, 132. The first surfaces 121, 131 are used to bond lead-tin solder balls 140 for surface mounting, the second surface 122, 132 are used to adhere chip 110 jointly. The first surface 121 of left circuit board 120 and the first surface 131 of right circuit board 130 are formed on a same plane. It is better that there is a same thickness for left circuit board 120 and right circuit board 130. Preferably, the total area of the first surface 121,131 of left circuit board 120 and right circuit board 130 is not larger than 1.2 times the area of the surface having bonding pads 111 of chip 110, so as to form a chip scale package. Besides, between adjacent circuit boards 120, 130 there is a galley 170 exposing the bonding pads 111 of chip 110 after adhering chip 110 for passing through metal bonding wires 140 made of gold, copper or copper alloy to electrically connect the chip 110 with left circuit board 120 and right circuit board 130 by wire bonding method (that is the inner electrical interconnection of the chip 110 and multiple circuit board 120, 130). In this embodiment as shown in FIG. 3, left circuit board 120 and right circuit board 130 are constructed on a same circuit board before the encapsulant body 150 is formed. There is an opening longer than a side length of overall multi-board BGA package 100. After adhering the chip 110, wire bonding the metal bonding wires 140 and forming the encapsulant body 150, along the cutting path 191, the circuit board is cut into left circuit board 120 and right circuit board 130 separately, meantime a galley 170 is formed.

The encapsulant body 150 is a thermosetting insulation material such as epoxy resin including filler, in this embodiment formed by molding method. As shown in FIG. 4, the assembly having chip 110 and circuit board 120, 130 is set in between an upper mold 410 and an under mold 420 to inject unsetting encapsulant body 150. The foregoing opening is used to be a galley 170 and longer than side length of entire multi-board BGA package, so that the encapsulant body 150 is easy to be filled into the galley 170 and on the second surface 122,123 of the circuit board 120,130 without air-pocket to cause the problems of encapsulating.

In the foregoing multi-board BGA package 100, the chip 110 is supported by multiple circuit boards 120,130 jointly. While the multi-board BGA package 100 is surface-mounted to a printed circuit board such as mother board or memory module board, the multiple circuit boards 120,130 disperse the thermal stress caused by CTE mismatch so as to avoid warping of the multi-board BGA package 100 or disconnection of solder balls 160.

Figure 5:
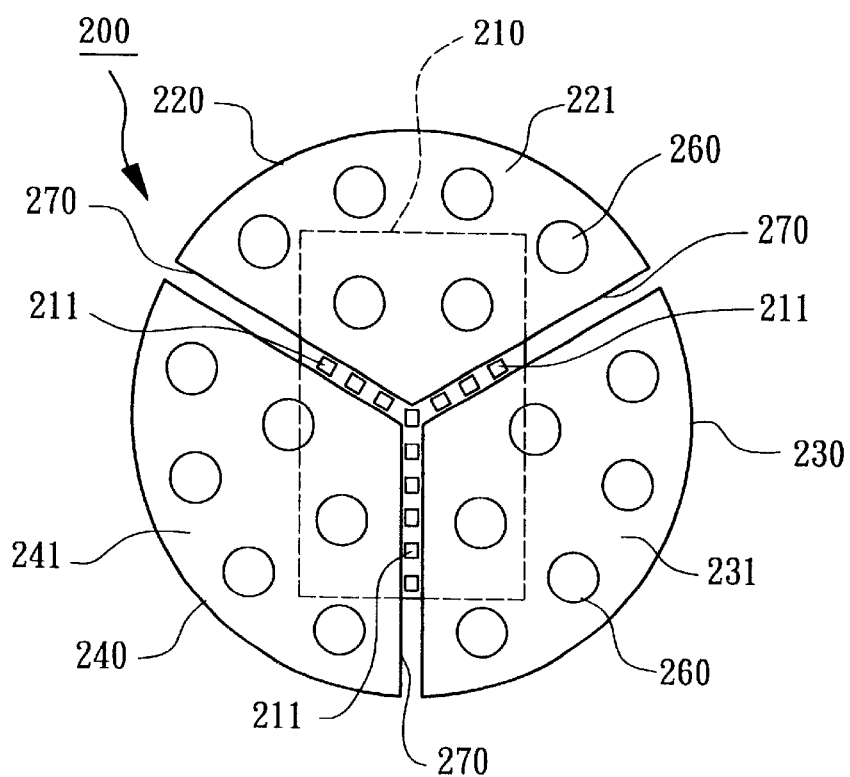
FIG. 5 is a top view of a multi-board BGA package in accordance with the second embodiment of the present invention.

For the present invention, the quantity of circuit board is unlimited. A multi-board BGA package 200 with three circuit boards will be illustrated in the second embodiment of the present invention. As shown in FIG. 5, the multi-board BGA package 200 mainly comprises a chip 210, three circuit boards 220,230,240, a plurality of metal bonding wires (not shown) and a plurality of solder balls 260. A plurality of solder balls 260 are formed on the first surfaces 221,231,241 of circuit boards 220,230,240 which are formed on a same plane. The first 220, the second 230 and the third 240 circuit board together hold the chip 210 and form a surface-mounting plane which is circle. There is a galley between the first 220 and the second 230 circuit boards, the first 220 and the third 240 circuit boards, the second 230 and the third 240 circuit boards respectively for exposing the bonding pad 211 of chip 210.

Figure 6:
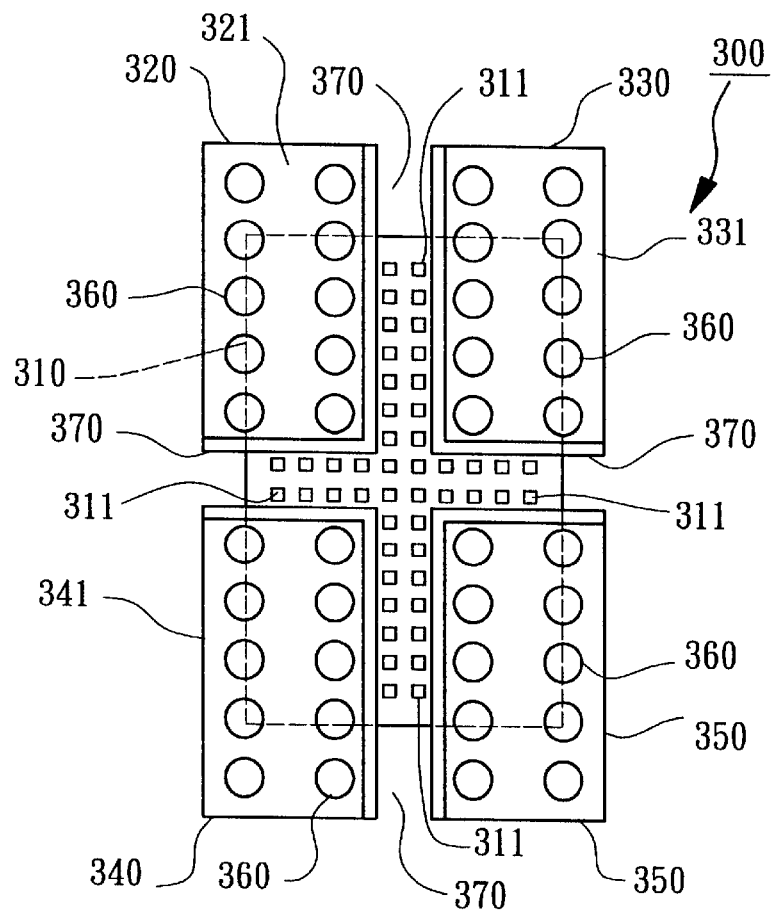
FIG. 6 is a top view of a multi-board BGA package in accordance with the third embodiment of the present invention.
Figure 7:
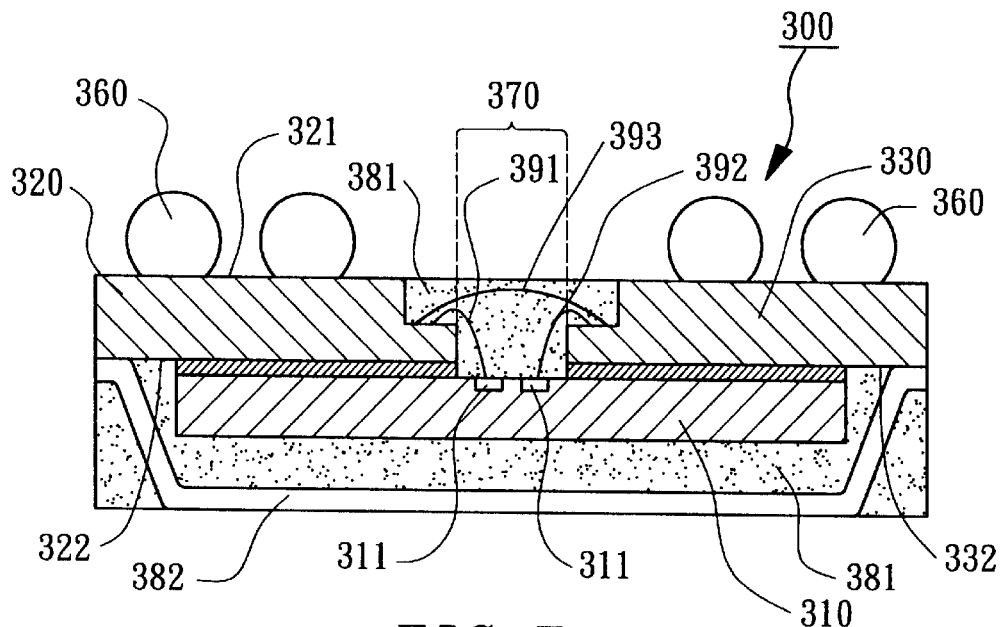
FIG. 7 is a cross-sectional view of a multi-board BGA package in accordance with the third embodiment of the present invention.
Figure 8:
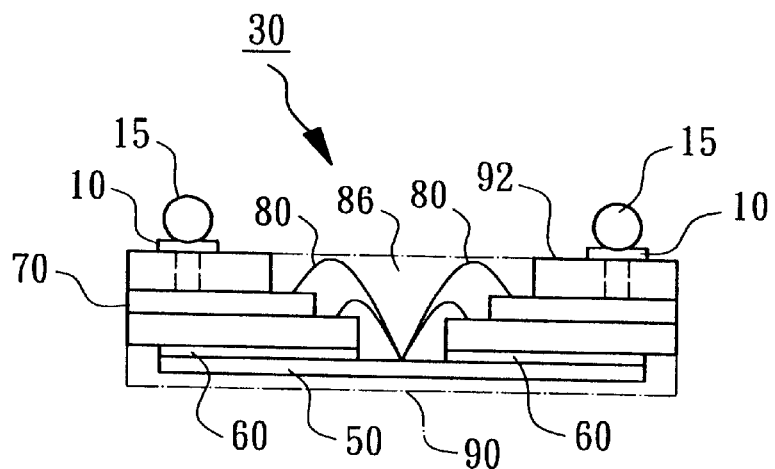
FIG. 8 is a cross-sectional view of an integrated circuit package disclosed in U.S. Pat. No. 6,049,129 "chip size integrated circuit package".
Figure 9:
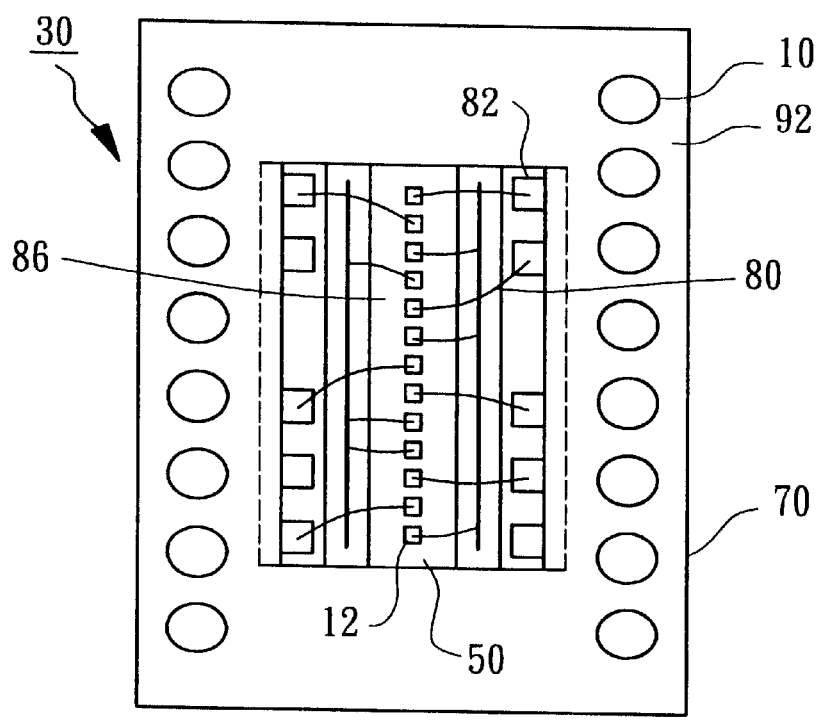
FIG. 9 is a top view of an integrated circuit package disclosed in U.S. Pat. No. 6,049,129 "chip size integrated circuit package".

In the third embodiment as shown in FIG. 6, 7, a multi-board BGA package 300 includes a chip 310 adhering with four circuit boards 320,330,340,350 together. The first surfaces 321,331,341,351 of the circuit boards 320,330,340, 350 are formed on a same plane and are bonded with a plurality of solder balls 360 for surface mounting. There is a galley 370 formed between adjacent circuit boards 320, 330,340,350 for exposing the bonding pads 311 of chip 310 and providing a flexible space. As shown in FIG. 7, a plurality of metal bonding wires 391 electrically connect the chip 310 with the first circuit board 320 and a plurality of metal bonding wires 392 electrically connect the chip 310 with the second circuit board 330 through the galley 370. Further there is at least a metal bonding wire 393 electrically connect the first circuit board 320 with the second circuit board 330. In this embodiment, the circuit boards 320,330, 340,350 are multi-layer printed circuit boards and each has a ladder-like section at the brim of the galley 370 for keeping the metal bonding wires 391, 392, and 393 under the first surfaces 321,331,341,351 of the circuit boards 320,330,340, 350. Besides, a multi-board BGA package 300 further comprises an encapsulant body 381 and a heat-dissipating board 382, the encapsulant body 381 is formed on galley 370 and another surface of circuit boards 320,330,340,350 that is different from the first surface 321,331,341,351 (such as the second surface 322 of the first circuit board 320 and the second surface 332 of the second circuit board 330). The heat-dissipating board 382 is also installed on another surface of circuit boards 320,330,340,350 and has a heat-dissipating surface without covered by the encapsulant body 381 for improving heat-dissipation of the multi-board BGA package 300 and fixing the circuit boards 320,330,340,350. Due to the chip 310 adhered by the plurality of circuit boards 320,330,340,350, the multi-board BGA package 300 is able to reduce thermal stress caused by CTE mismatch and has a well-molding property.

The above description of embodiments of this invention is intended to be illustrative and not limiting. Other embodiments of this invention will be obvious to those skilled in the art in view of the above disclosure.

What is claimed is:

1. A multi-board BGA package comprising:
   a plurality of circuit boards, each circuit board having a first surface and a second surface, wherein the first surfaces of the circuit boards are formed on a same plane and there is a galley between adjacent circuit boards;
   at least a chip adhered onto the second surfaces of the circuit boards, and having a plurality of bonding pads;
   a plurality of metal bonding wires connecting the bonding pads of the chip with the circuit boards through the galley;
   an encapsulant body being formed on the galley and the second surfaces of the circuit boards; and
   a plurality of solder balls bonding on the first surfaces of the circuit boards.

2. The multi-board BGA package in accordance with claim 1, wherein the plurality of circuit boards are printed circuit boards.

3. The multi-board BGA package in accordance with claim 1, comprising two circuit boards.

4. The multi-board BGA package in accordance with claim 1, wherein the plurality of circuit boards have a same thickness.

5. The multi-board BGA package in accordance with claim 1, wherein the total area of the first surfaces of the circuit boards is not larger than 1.2 times the area of the surface of the chip having bonding pads.

6. The multi-board BGA package in accordance with claim 1, further comprising a heat-dissipating device.

7. An integrated circuit package comprising:
- a plurality of circuit boards, each circuit board having the first surface and the second surface, wherein the first surfaces of the plurality of circuit boards are formed on a same plane and there is a galley between adjacent circuit boards;
- a chip adhered on the second surfaces of the circuit boards and having a plurality of bonding pads;
- a plurality of metal bonding wires connecting the bonding pads of the chip with the circuit boards through the galley; and
- an encapsulant body formed in the galley.

8. The integrated circuit package in accordance with claim 7, further comprising a plurality of solder balls bonded on the first surfaces of the circuit boards.

9. The integrated circuit package in accordance with claim 7, wherein the plurality of circuit boards are printed circuit boards.

10. The integrated circuit package in accordance with claim 7, comprising two circuit boards.

11. The integrated circuit package in accordance with claim 7, wherein the plurality of circuit boards have a same thickness.

12. The integrated circuit package in accordance with claim 7, wherein the total area of the first surfaces of a plurality of circuit boards is not larger than 1.2 times the area of the surface of the chip having bonding pads.

13. The integrated circuit package in accordance with claim 7, further comprising a heat-dissipating device.

* * * * *